(12) United States Patent
Hong et al.

(10) Patent No.: US 8,999,204 B2
(45) Date of Patent: Apr. 7, 2015

(54) CONDUCTIVE INK COMPOSITION, METHOD FOR MANUFACTURING THE SAME, AND METHOD FOR MANUFACTURING CONDUCTIVE THIN LAYER USING THE SAME

(75) Inventors: Jae-Min Hong, Seoul (KR); Yong-Won Song, Seoul (KR); Yong-Ju Jung, Seoul (KR); Hee-Dok Choi, Incheon (KR); Won-Suk Han, Gyeonggi-do (KR); Hak-Sung Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 604 days.

(21) Appl. No.: 13/248,924

(22) Filed: Sep. 29, 2011

(65) Prior Publication Data

US 2012/0251736 A1 Oct. 4, 2012

(30) Foreign Application Priority Data

Mar. 29, 2011 (KR) ........................ 10-2011-0028462

(51) Int. Cl.
| | |
|---|---|
| *H01B 1/16* | (2006.01) |
| *H01B 1/22* | (2006.01) |
| *B05D 5/12* | (2006.01) |
| *C09D 11/52* | (2014.01) |
| *C09D 11/106* | (2014.01) |
| *H05K 1/09* | (2006.01) |
| *B41M 3/00* | (2006.01) |
| *B41M 7/00* | (2006.01) |
| *B82Y 30/00* | (2011.01) |
| *H05K 3/12* | (2006.01) |

(52) U.S. Cl.
CPC *H01B 1/22* (2013.01); *C09D 11/52* (2013.01); *C09D 11/106* (2013.01); *H05K 1/095* (2013.01); *B41M 3/006* (2013.01); *B41M 7/009* (2013.01); *B82Y 30/00* (2013.01); *H05K 3/1283* (2013.01); *H05K 2201/0272* (2013.01); *H05K 2203/107* (2013.01)

(58) Field of Classification Search
USPC .......... 252/500, 512–514; 427/58, 96.1, 99.2, 427/99.4, 123, 383.1
See application file for complete search history.

(56) References Cited

U.S. PATENT DOCUMENTS

| | | | |
|---|---|---|---|
| 2005/0136638 A1* | 6/2005 | Voss-Kehl et al. | 438/610 |
| 2009/0274834 A1* | 11/2009 | Chopra et al. | 427/125 |
| 2010/0009071 A1* | 1/2010 | Chopra et al. | 427/123 |

OTHER PUBLICATIONS

Yong-Ju Jung, et al; "Highly Conductive Cu-Ag Thin Films Prepared by Nanostructure-Enhanced Light Sintering for Flexible Devices", Oct. 7, 2010, The Polymer Society of Korea Fall Meeting, Oct. 7 and 8, 2010, 1 page.

\* cited by examiner

*Primary Examiner* — Mark Kopec
(74) *Attorney, Agent, or Firm* — Ladas & Parry LLP

(57) ABSTRACT

Disclosed is a conductive ink composition, a manufacturing method thereof, and a manufacturing method of a conductive thin film using the same, and more specifically, a conductive ink composition is provided that includes composite metal nanoparticles including first metal nanoparticles and second metal nanoparticles, and a polymer matrix. The polymer matrix is a composition including a polymer and a solvent, the first metal nanoparticles and the second metal nanoparticles are different metals, and the content of the composite metal nanoparticles is about 20 to about 25 wt %, the content of the polymer is about 5 to about 10 wt %, and the content of the solvent is about 65 to about 75 wt %, based on the total weight of the composition.

15 Claims, 7 Drawing Sheets

CONDUCTIVE INK COMPOSITION, METHOD FOR MANUFACTURING THE SAME, AND METHOD FOR MANUFACTURING CONDUCTIVE THIN LAYER USING THE SAME

CROSS-REFERENCE TO RELATED APPLICATION

This application claims priority to and the benefit of Korean Patent Application No. 10-2011-0028462 filed in the Korean Intellectual Property Office on Mar. 29, 2011, the entire contents of which are incorporated herein by reference.

BACKGROUND OF THE INVENTION (a) Field of the Invention

A conductive ink composition, a method for manufacturing the same, and a method for manufacturing a conductive thin film using the same are provided.

(b) Description of the Related Art

In the existing semiconductor process, a circuit board is a board wherein a circuit pattern for electrically connecting a circuit device is formed on an insulation substrate formed of bakelite or synthetic resin, and the manufacturing method is largely divided into a subtractive method and an additive method.

The subtractive method is a method of removing parts excluding a required circuit pattern by etching and the like after wholly forming a conductive thin film on a substrate, and the additive method is a method of directly forming a circuit pattern on a substrate by plating or printing.

At present, most circuit boards are manufactured by etching, which is a representative subtractive method. According to the etching, a copper foil is laminated on an insulation substrate to form a laminate, an acid resistant material (resist) is coated only on a part corresponding to a circuit pattern on the surface of the laminate, and then parts other than the circuit pattern are dissolved to remove them, thereby forming a circuit pattern.

However, when a circuit board is manufactured by etching, since a complicated processes including formation of a laminate, resist coating, resist etching and washing, and the like should be conducted, a lot of time is consumed for the manufacturing process and production cost may increase.

Further, a discharged solution generated during the manufacturing process causes environmental problems, and to prevent this, treatment such as neutralization and the like is essentially involved, which also causes a cost increase.

The additive method is an alternative for solving the drawbacks of the circuit board manufacturing process by etching, and is a method of directly printing conductive ink on a substrate by printing such as inket printing to embody a circuit pattern, thus easily and inexpensively manufacturing a circuit board.

Since the additive method may print with a desired thickness at desired position, simplify the manufacturing process, reduce production cost, and does not cause environmental problems, the application range is being broadened.

In the additive method, ink sintering may be largely divided into heat sintering and laser sintering.

However, since commercially available heat sintering and laser sintering methods require high energy and a long sintering time, problems such as cost increase are raised.

Accordingly, the inventors studied a conductive ink composition suitable for an additive method (e.g., inket printing method), a manufacturing method of the same, and a method for effectively sintering a pattern formed using the ink.

SUMMARY OF THE INVENTION

An exemplary embodiment of the present invention provides a conductive ink composition and a method for manufacturing the same.

Another embodiment of the present invention provides a method for effectively manufacturing a conductive thin film using the conductive ink composition.

According to one embodiment of the present invention, a conductive ink composition is provided that includes composite metal nanoparticles including first metal nanoparticles and second metal nanoparticles, and a polymer matrix, wherein the polymer matrix is a composition including a polymer and a solvent, the first metal nanoparticles and the second metal nanoparticles are different metals, and the content of the composite metal nanoparticles is about 20 to about 25 wt %, the content of the polymer is about 5 to about 10 wt %, and the content of the solvent is about 65 to about 75 wt %, based on the total weight of the composition.

The metal of the first metal nanoparticles may be copper.

The weight ratio of the first metal nanoparticles to the second metal nanoparticles may be about 3 to about 9.

The metal of the second metal nanoparticles may be silver, gold, nickel, or a combination thereof.

The first metal nanoparticles and the second metal nanoparticles may independently have a shape of a thin sheet, a rod, a needle, or a sphere.

The first metal nanoparticles may have a particle diameter of about 20 to about 50 nm.

The second metal nanoparticles may have a particle diameter of about 10 to about 40 nm.

The polymer may be polyvinylpyrrolidone, polymethylmethacrylate, polymethyl(meth)acrylate, polyvinylacetate, or a combination thereof.

The solvent may be diethylene glycol, 2-methoxyethanol, 2-butoxymethoxyethanol, ethanol, or a combination thereof.

According to another embodiment of the present invention, a method for manufacturing a conductive ink composition is provided that includes: dissolving a polymer in a first solvent to prepare a polymer matrix; mixing first metal nanoparticles and second metal nanoparticles to prepare composite metal nanoparticles; dispersing the composite metal nanoparticles in a second solvent to prepare a dispersion of composite metal nanoparticles; and dispersing the dispersion of the composite metal nanoparticles in the polymer matrix.

The metal of the first metal nanoparticles may be copper.

The weight ratio of the first metal nanoparticles to the second metal nanoparticles may be about 3 to about 9.

The metal of the second metal nanoparticles may be silver, gold, nickel, or a combination thereof.

The first metal nanoparticles and the second metal nanoparticles may independently have a shape of a thin sheet, a rod, a needle, or a sphere.

The first metal nanoparticles may have a particle diameter of about 20 to about 50 nm.

The second metal nanoparticles may have a particle diameter of about 10 to about 40 nm.

The polymer may include polyvinylpyrrolidone, polymethylmethacrylate, polymethyl(meth)acrylate, polyvinylacetate, and a combination thereof.

The first solvent may be diethylene glycol.

The second solvent may include 2-methoxyethanol, 2-butoxymethoxyethanol, ethanol, or a combination thereof.

The method may further include ultrasonication of the dispersion, after dispersing the composite metal nanoparticles in the second solvent to prepare a dispersion of composite metal nanoparticles.

The ultrasonication of the dispersion may be conducted for about 1 to about 3 hours.

The method may further include filtering the prepared conductive ink composition using a glass fiber filter.

According to yet another embodiment of the present invention, a method for manufacturing a conductive thin film is provided that includes preparing a substrate, printing a conductive ink composition on the substrate to form a pattern, and light sintering the formed pattern.

In the forming of the pattern, the printing may include Inkjet printing, spin coating, roll-to-roll printing, screen printing, and a combination thereof.

The substrate may be a polyimide, polyethylene terephthalate, glass, or a silicon wafer.

In the light sintering of the formed pattern, the light may be pulsed light. The pulsed light may have pulse energy of about 11 to about 33 J/cm$^2$.

The pulse width of the pulsed light may be about 1.5 to about 5 ms.

The pulse number of the pulsed light may be about 1 to about 99.

A conductive ink composition with a high concentration where conductive metal nanoparticles are uniformly dispersed, and a manufacturing method of the same, may be provided.

A manufacturing method of a conductive thin film using the conductive ink composition with low energy, low cost, or a short process time may also be provided.

DETAILED DESCRIPTION

Exemplary embodiments will hereinafter be described in detail. However, these embodiments are only exemplary, and the present invention is not limited thereto.

On embodiment of the present invention provides a conductive ink composition including composite metal nanoparticles including first metal nanoparticles and second metal nanoparticles, and a polymer matrix, wherein the polymer matrix is a composition including polymer and a solvent, the first metal nanoparticles and the second metal nanoparticles are different metals, and the content of the composite metal nanoparticles is about 20 to about 25 wt %, the content of the polymer is about 5 to about 10 wt %, and the content of the solvent is about 65 to about 75 wt %, based on the total weight of the composition.

Figure 1:
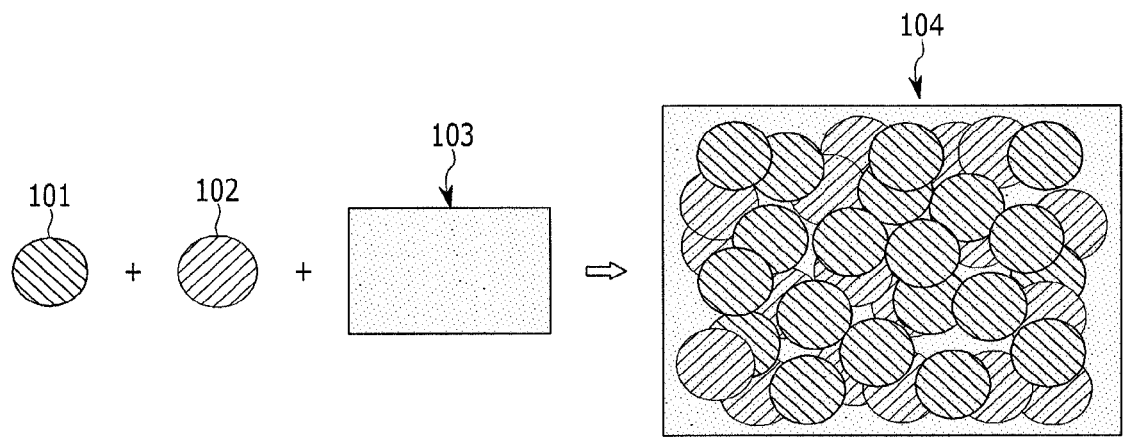
FIG. 1 is a schematic view of a conductive ink composition according to one embodiment of the present invention.

FIG. 1 is a schematic view of a conductive ink composition according to one embodiment of the present invention.

In FIG. 1, 101 is a first metal nanoparticle, 102 is a second metal nanoparticle, 103 is a polymer matrix, and 104 is a conductive ink composition.

The conductive ink composition includes uniformly dispersed first metal nanoparticles and second metal nanoparticles.

The metal of the first metal nanoparticles may be copper.

The copper is economically favorable, and has relatively excellent electrical conductivity compared to other metals.

If different kinds of metal nanoparticles are used in the conductive ink composition, drawbacks of different metals may be compensated.

For example, if the first metal is copper, the second metal dispersed in the polymer matrix may partially compensate deterioration of electrical conductivity due to an oxide film on the surface thereof, which is a drawback of the copper nanoparticles.

The weight ratio of the first metal nanoparticles to the second metal nanoparticles may be about 3 to about 9.

That is, the first metal nanoparticles may be added in an excessive amount compared to the second metal nanoparticles. For example, if the first metal nanoparticle is copper, a higher content may be advantageous in terms of electrical conductivity and economical efficiency.

However, if the weight ratio of the first metal nanoparticles to the second metal nanoparticles exceeds about 9, desired electrical conductivity may be difficult to obtain due to the oxide film of the copper nanoparticles.

The metal of the second metal nanoparticles may be silver, gold, nickel, or a combination thereof. More specifically, it may be silver or nickel. The second metal nanoparticles may compensate the drawback of the first metal nanoparticles.

Carbon particles may be used instead of the second metal nanoparticles. Specific examples of the carbon particles may include carbon nanotubes, carbon nanorods, and the like. Since the carbon particles have excellent electrical conductivity, they may have the same function as the second metal nanoparticles.

If the metal of the first metal nanoparticles is copper and the metal of the second metal nanoparticles is silver, the silver nanoparticles may partially compensate deterioration of electrical conductivity due to an oxide film of the copper nanoparticles.

From an economic point of view, mixing of the copper nanoparticles and silver nanoparticles may be more effective than using expensive silver nanoparticles alone.

However, in the case of the composite metal nanoparticles, when printing on a substrate and sintering, light sintering may be more suitable than commonly-used heat sintering. More specifically, pulsed light may be used. This will be explained in yet another embodiment of the present invention.

The first metal nanoparticles and the second metal nanoparticles may independently have a shape of a thin sheet, a rod, a needle, or a sphere.

The shape may be appropriately selected such that the composite metal nanoparticles may be uniformly deposited when printed on a substrate. Uniformly deposited composite metal nanoparticles may be advantageous in terms of electrical conductivity, compared to those non-uniformly deposited.

The first metal nanoparticles may have a particle diameter of about 20 to about 50 nm, and the second metal nanoparticle may have a particle diameter of about 10 to about 40 nm.

If the particle diameter range is satisfied, melting points of the first metal nanoparticles and the second metal nanoparticles may be lowered and they are sintered with lower energy, thus minimizing damage to the substrate.

Further, as the particle diameter decreases, pores may be decreased to obtain a better sintering effect.

The polymer may include polyvinylpyrrolidone, polymethylmethacrylate, polymethyl(meth)acrylate, polyvinylacetate, and a combination thereof.

The polymer may increase the degree of dispersion of the composite metal nanoparticles in the composition. Further, when the composite metal nanoparticles form a pattern on a substrate, it may increase cohesion of the composite metal nanoparticles and the substrate.

The solvent may include diethylene glycol, 2-methoxyethanol, 2-butoxymethoxyethanol, ethanol, or a combination thereof.

The solvent may sufficiently dissolve the polymer, and it may be effective for dispersing the composite metal nanoparticles.

The content of the composite metal nanoparticles may be about 20 to about 25 wt %, the content of the polymer may be about 5 to about 10 wt %, and the content of the solvent may be about 65 to about 75 wt %, based on the total weight of the composition.

If the content of the composite metal nanoparticles exceeds about 25 wt %, a nozzle may be blocked during printing, and if the content is less than about 20 wt %, the content of the conductive material of the composite metal nanoparticles may become low and thus conductivity may be decreased due to cracks after pattern forming.

The conductive ink composition may include a small amount of ethanol in the polymer matrix to modify the ink for volatility of the ink and easy inkjet printing.

The content of the polymer may be about 5 to about 10 wt %.

If the content of the polymer exceeds about 10 wt %, viscosity of the ink composition may increase to cause problems when printing, and if the content is less than about 5 wt %, viscosity of the ink may be decreased and there may be a problem in the degree of dispersion of the composite metal nanoparticles.

Specific examples of the polymer are as described above, and are omitted here. Further, the polymer may have a molecular weight of about 8000 to about 40,000.

The content of the solvent may be about 65 to about 75 wt %.

If the content of the solvent exceeds about 75 wt %, the content of the composite metal nanoparticles in the ink composition may become low and thus a printing process should be repeated many times, and if the content is less than about 65 wt %, the degree of dispersion of the composite metal nanoparticles in the composition may be decreased.

According to another embodiment of the present invention, a method for manufacturing a conductive ink composition is provided that includes dissolving a polymer in a first solvent to prepare a polymer matrix, mixing first metal nanoparticles and second metal nanoparticles to prepare composite metal nanoparticles, dispersing the composite metal nanoparticles in a second solvent to prepare a dispersion of composite metal nanoparticles, and dispersing the dispersion of the composite metal nanoparticles in the polymer matrix.

The first metal nanoparticles and the second metal nanoparticles are identical to the above-described embodiment of the present invention, and the explanations are omitted here.

In addition, the polymer is identical to the above-described embodiment of the present invention, and the explanation is omitted here.

The first solvent may be diethylene glycol. The first solvent is the same as the solvent included in the polymer matrix in the above-described embodiment of the present invention, and the explanation is omitted here.

The second solvent may include 2-methoxyethanol, 2-butoxymethoxyethanol, ethanol, and a combination thereof.

The first solvent may be a suitable solvent for preparing the polymer matrix, and the second solvent may be a suitable solvent for dispersing the composite metal nanoparticles. However, these solvents may be mixed in a range that does not limit each characteristic.

The method may further include ultrasonication of the dispersion, after dispersing the composite metal nanoparticles in the second solvent to prepare a dispersion of composite metal nanoparticles.

The ultrasonication of the dispersion may be conducted for about 1 to about 3 hours. The ultrasonication is used to increase the degree of dispersion of the composite metal nanoparticles in the conductive ink composition. It may be selectively conducted according to a desired dispersion degree.

The manufacturing method may further include filtering the prepared conductive ink composition using a glass fiber filter.

Nozzle blocking may be prevented by the above step.

According to yet another embodiment of the present invention, a method for manufacturing a conductive thin film is provided that includes preparing a substrate, printing the above-described conductive ink composition, and light sintering the formed pattern.

Figure 2:
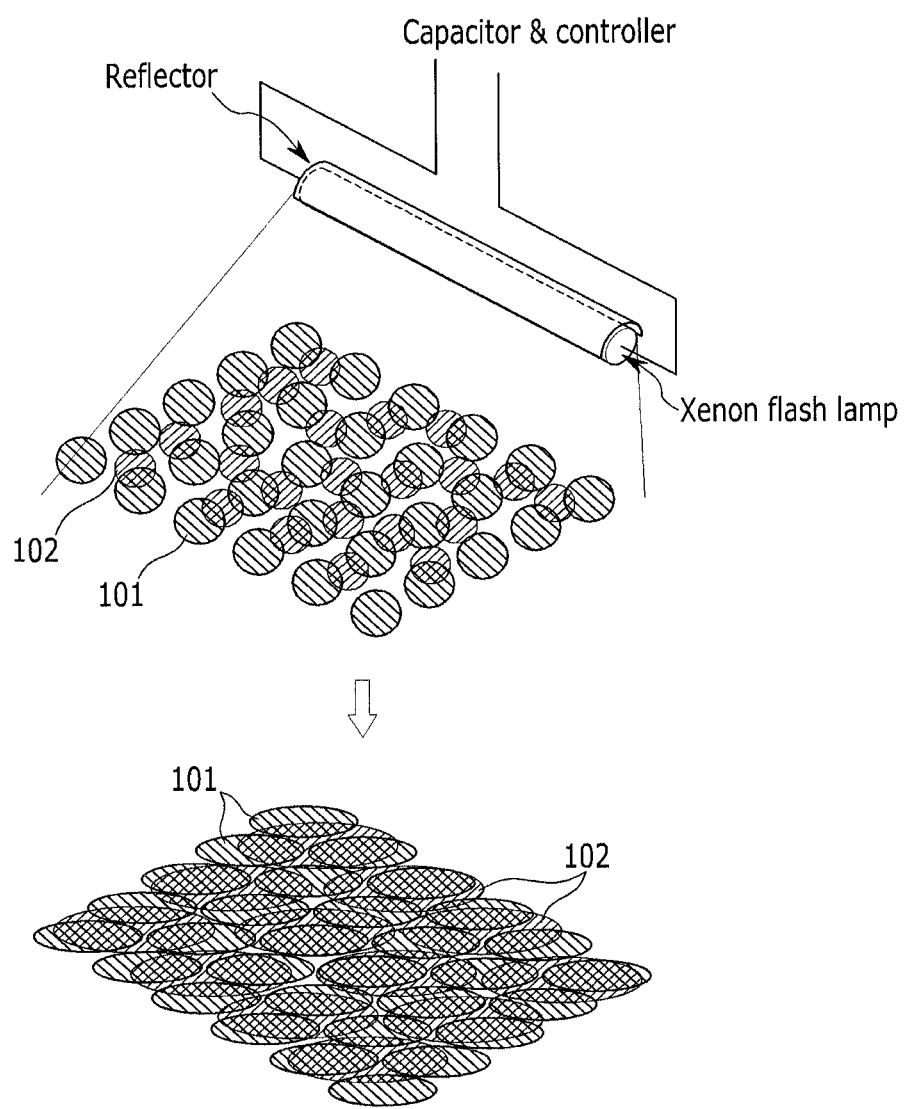
FIG. 2 is a schematic view of a manufacturing process of a conductive thin film.

FIG. 2 is a schematic view of a manufacturing process of a conductive thin film.

In FIG. 2, 101 is the first metal nanoparticles, and 102 is the second metal nanoparticles.

In the forming of the pattern, the printing may include Inkjet printing, spin coating, roll-to-roll printing, screen printing, or a combination thereof. However, printing is not limited thereto as long as it is an additive method.

The substrate may a polyimide, polyethylene terephthalate, glass, or a silicon wafer, and it may be selected according to a desired product.

In the sintering of the formed pattern, the light may be pulsed light.

The light sintering method has a merit of enabling sintering at room temperature and atmospheric pressure, and rapid sintering at millisecond (ms) units.

Further, sintering is progressed using a spectrum light source, a large area may be sintered, and sintering may be conducted without the necessity of a high energy source.

Further, sintering may be selectively conducted by controlling conditions of light sintering.

Since the conductive ink composition according to one embodiment of the present invention includes different kinds of composite metal nanoparticles having high conductivity that are uniformly dispersed in a polymer matrix, contact resistance of the nanoparticles may be decreased while light sintering to improve electrical conductivity of the pattern formed on the substrate.

Further, since the conductive ink composition may be sintered with lower light energy, it may be usefully applied for development of a flexible device for a printing device having excellent electrical conductivity without damage to the substrate.

In the light sintering, it may be important to sinter while reducing contact resistance between composite metal nanoparticles using specific light pulsed energy.

For this, the pulse energy of the pulsed light may be about 11 to about 30 J/cm$^2$.

The pulse width of the pulsed light may be about 1.5 to about 5 ms.

The pulse number of the pulsed light may be about 1 to about 99, about 1 to about 50, about 5 to about 20, or about 2 to about 10. The pulse number means the number of pulses of the pulsed light.

The pulse number of the pulsed light is explained as follows.

The pulse number may be based on the on/off pulse width. The pulse width of the pulsed light may be about 1.5 to about 5 ms when the pulse is on.

The off-time may be about 5 to about 10 ms when the pulse is off.

Therefore, a time for repeating on/off one time may be represented by one time/(on-time+off-time), which may be about 0.06 times per millisecond to about 0.15 times per millisecond.

Among the above conditions, those where sintering may effectively occur according to the kind of metal of the composite metal nanoparticles may be selected.

The light sintered pattern may be analyzed for characteristics such as a component, a shape, electrical conductivity, and the like, using a scanning electron microscope (SEM), a focused ion beam (FIB), energy dispersive spectroscopy (EDS), X-Ray diffraction (XRD), semiconductor analysis, (SA), and the like.

Hereinafter, the embodiments are illustrated in more detail with reference to examples. However, the following are exemplary embodiments and are not limiting.

Manufacture of Conductive Ink Composition

EXAMPLE 1

Copper nanoparticles and silver nanoparticles were mixed at a ratio of about 3:1 to prepare about 1.9 g of composite metal nanoparticles.

The composite metal nanoparticles were added to about 8 ml of a solvent including 2-methoxyethanol and 2-(2-butoxyethoxy)ethanol mixed at a ratio of about 3:1, and the mixture was treated by ultrasonication for about 2 hours.

To the prepared dispersion of copper-silver (Cu—Ag) composite metal nanoparticles, a solution including about 0.5 g of poly(N-vinylpyrrolidone) dissolved in about 3.3 g of a solvent of diethylene glycol was added while agitating and treated by ultrasonication for about 2 hours.

The prepared conductive ink composition was continuously agitated, and filtered using a glass fiber filter.

EXAMPLE 2

A conductive ink composition was prepared by substantially the same method as in Example 1, except that the copper nanoparticles and the silver nanoparticles were mixed in a ratio of about 5:1 instead of the ratio of about 3:1.

EXAMPLE 3

A conductive ink composition was prepared by substantially the same method as in Example 1, except that the copper nanoparticles and the silver nanoparticles were mixed in a ratio of about 7:1 instead of the ratio of about 3:1.

EXAMPLE 4

A conductive ink composition was prepared by substantially the same method as in Example 1, except that the copper nanoparticles and the silver nanoparticles were mixed in a ratio of about 9:1 instead of the ratio of about 3:1.

COMPARATIVE EXAMPLE 1

A conductive ink composition was prepared by substantially the same method as in Example 1, except that copper nanoparticles are used alone instead of mixing the copper nanoparticles and the silver nanoparticles at a ratio of about 3:1 as in Example 1.

Manufacture of Conductive Thin Film

EXAMPLE 5

A conductive thin film was manufactured using the conductive ink composition prepared in Example 1.

First, a polyimide substrate was cleaned by ultrasonication treatment for about 10 minutes.

The conductive ink composition of the Example 1 was coated on the substrate by spin coating, and dried at about 75° C. for about 1 hour to manufacture a conductive thin film.

The dried conductive thin film was sintered with pulsed light.

The light sintering conditions were as follow.

Pulse energy of about 11 to about 33 J/cm$^2$ was used, the pulse width was about 1.5 ms, and the pulse number was about 7.

EXAMPLE 6

A conductive thin film was manufactured by substantially the same method as in Example 5, except for using the conductive ink composition prepared in Example 2 instead of the conductive ink composition prepared in Example 1.

EXAMPLE 7

A conductive thin film was manufactured by substantially the same method as in Example 5, except for using the conductive ink composition prepared in Example 3 instead of the conductive ink composition prepared in Example 1.

EXAMPLE 8

A conductive thin film was manufactured by substantially the same method as in Example 5, except for using the conductive ink composition prepared in Example 4 instead of the conductive ink composition prepared in Example 1.

COMPARATIVE EXAMPLE 2

A conductive thin film was manufactured by substantially the same method as in Example 5, except for using the conductive ink composition prepared in Comparative Example 1 instead of the conductive ink composition prepared in Example 1.

EXPERIMENTAL EXAMPLE 1

Figure 3:
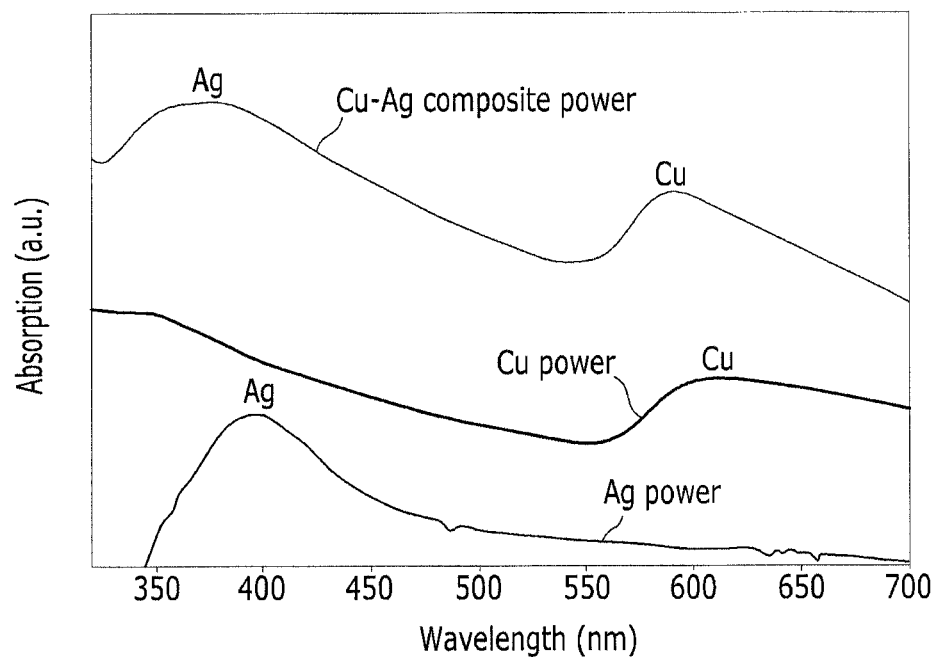
FIG. 3 shows absorption spectrum data of copper, silver, and copper-silver composite nanoparticles.

Absorption Spectrum Analysis of Copper, Silver, and Copper-Silver Composite Nanoparticles FIG. 3 shows absorption spectrum data of copper, silver, and copper-silver composite nanoparticles.

It is confirmed that the UV absorption spectrum of the Cu—Ag mixed nano-ink is wider than each UV absorption spectrum of the copper nano-ink and the silver nano-ink

EXPERIMENTAL EXAMPLE 2

SEM Photograph of Conductive Ink Composition

Figure 4:
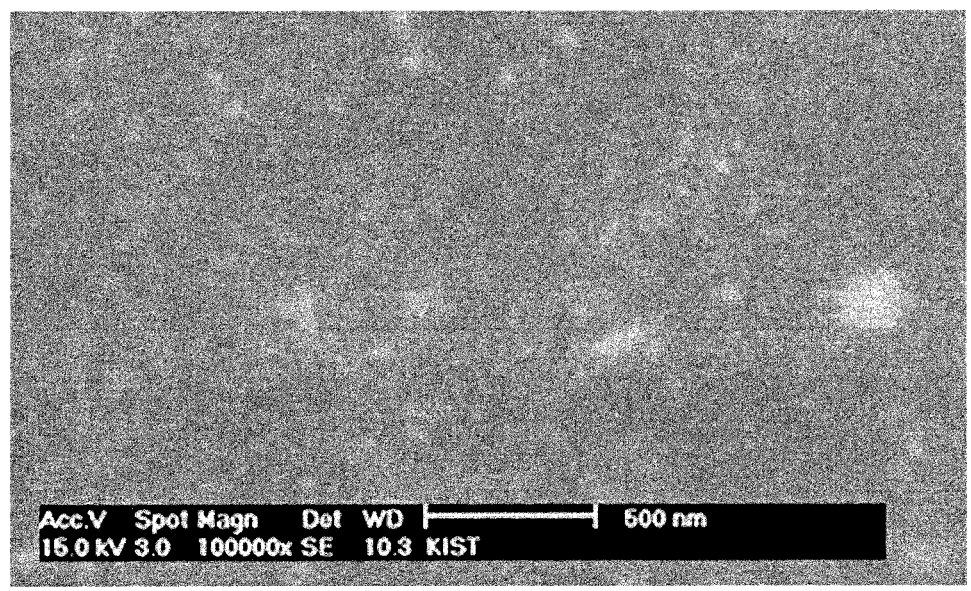
FIG. 4 shows a SEM photograph of the conductive ink composition according to Example 1.

FIG. 4 shows a SEM photograph of the conductive ink composition according to Example 1. As shown in FIG. 4, the copper nanoparticles and the silver nanoparticles are uniformly dispersed in the polymer matrix.

EXPERIMENTAL EXAMPLE 3

Sintering Effect Test with Identical Light Source

Figure 5:
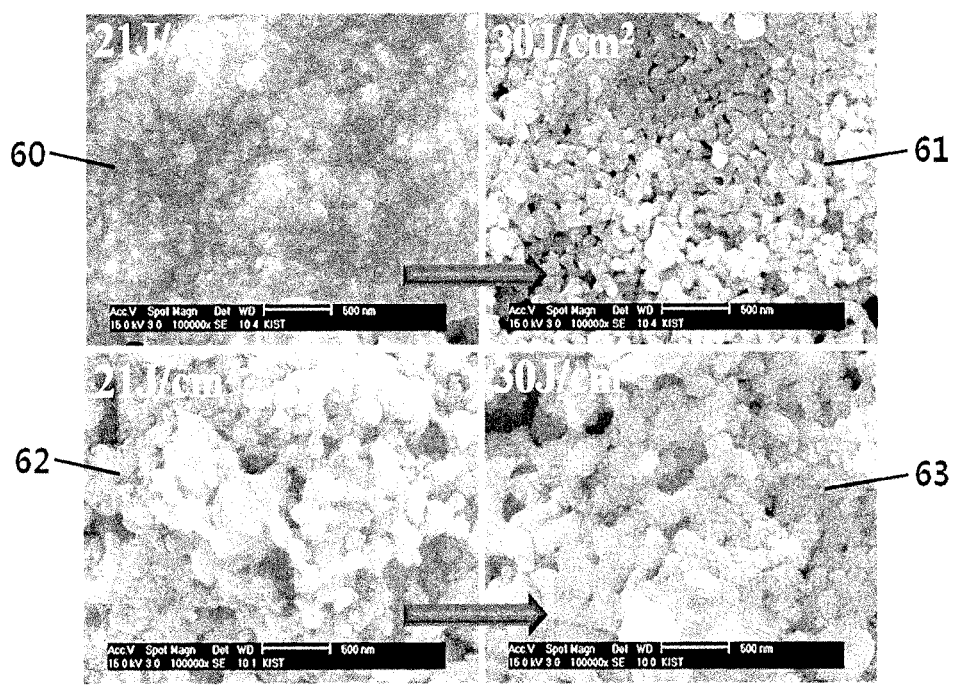
FIG. 5 shows SEM photographs illustrating the degree of sintering with energy of identical light sources.

FIG. 5 shows SEM photographs illustrating the degree of sintering with energy of the same light source.

In FIG. 5, 60 indicates copper nano-ink sintered with energy of about 21 J/cm$^2$, and 61 indicates copper nano-ink sintered with energy of about 30 J/cm$^2$.

In FIG. 5, 62 indicates the nano-ink of Example 1 sintered with energy of about 21 J/cm$^2$, and 63 indicates the nano-ink of Example 1 sintered with energy of about 30 J/cm$^2$.

Figure 6:
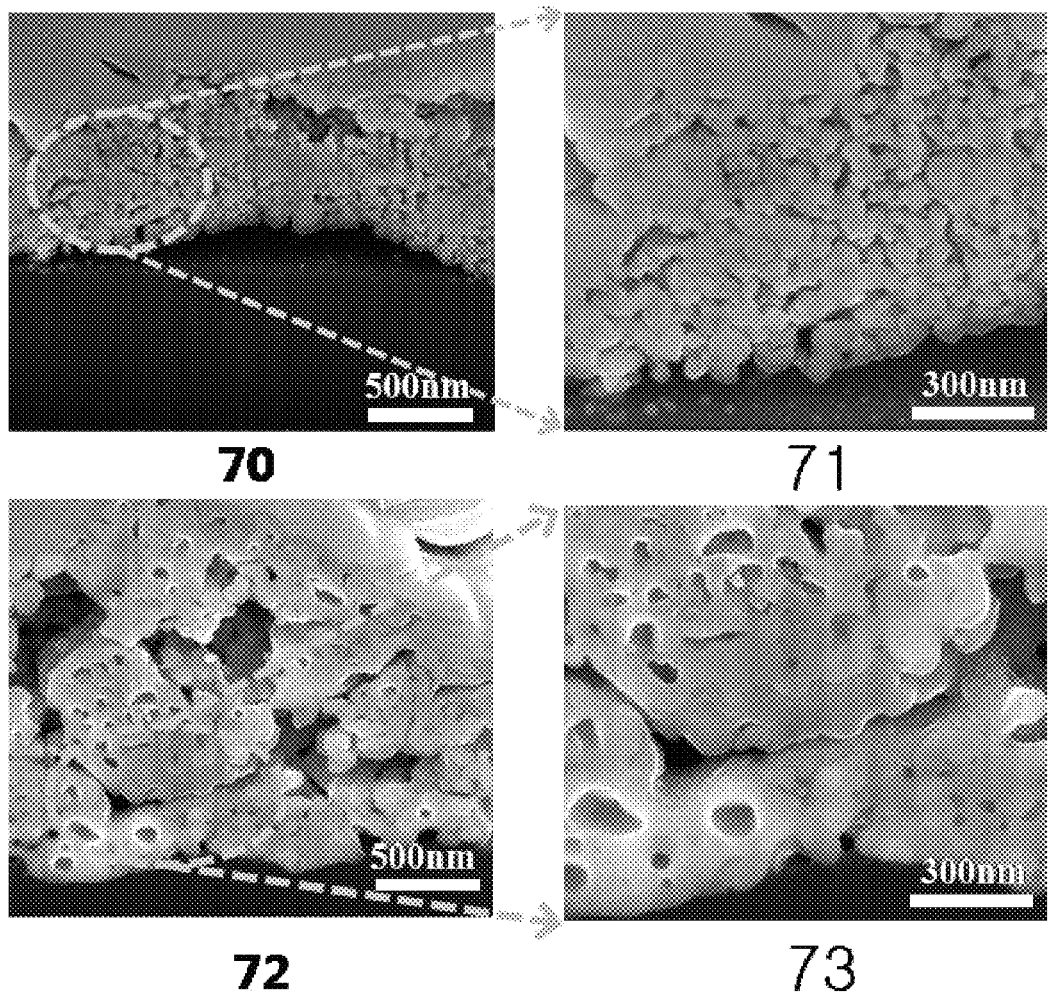
FIG. 6 shows focused ion beam (FIB) images illustrating the degree of sintering with energy of identical light source.

FIG. 6 shows focused ion beam (FIB) images illustrating the degree of sintering with energy of the same light source.

In FIG. 6, 70 indicates copper nano-ink sintered with energy of about 30 J/cm$^2$, and 71 is a magnified image of 70.

In FIG. 6, 72 indicates the nano-ink of Example 1 sintered with energy of about 30 J/cm$^2$, and 73 is a magnified image of 72.

As shown in FIG. 5 and FIG. 6, the sintering effect is excellent with energy of the same light source by mixing silver with copper nano-ink.

EXPERIMENTAL EXAMPLE 4

Figure 7:
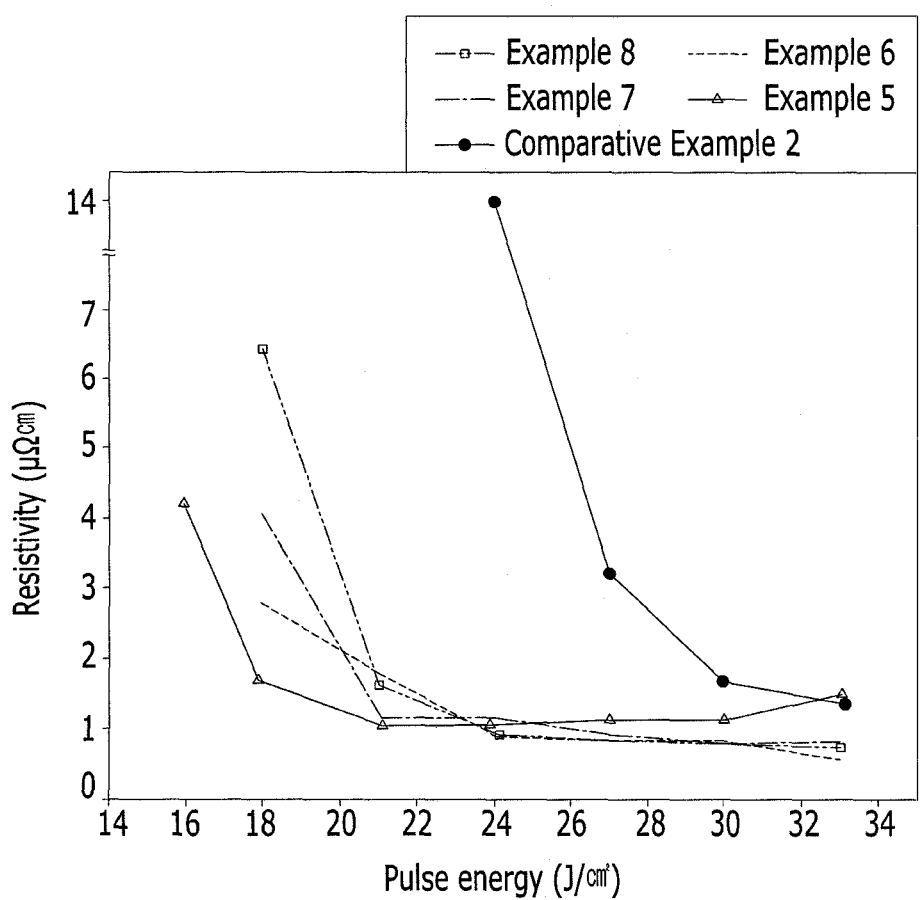
FIG. 7 shows data of measured electrical conductivity of the conductive thin films manufactured in Example 5 to 8 and Comparative Example 2.

Measurement of Resistance of Conductive Thin Film According to Each Metal Content of Composite Metal Nanoparticles FIG. 7 shows data of measured electrical conductivity of conductive thin films formed in Examples 5 to 8 and Comparative Example 2. They were measured by semiconductor analysis (SA).

As shown in FIG. 7, much lower resistivity was obtained than when using the existing copper nano ink-by adding silver.

It was also confirmed that energy required for sintering is lowered when silver is added.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting this disclosure in any way.

What is claimed is:

1. A conductive ink composition comprising
   a metal nanoparticles mixture including first metal nanoparticles and second metal nanoparticles, and a polymer matrix,
   wherein the polymer matrix is a composition including a polymer and a solvent,
   the first metal nanoparticles and the second metal nanoparticles are different metals,
   the content of the metal nanoparticles mixture is about 20 to about 25wt %, the content of the polymer is about 5 to about 10wt %, and the content of the solvent is about 65 to about 75wt %, based on the total weight of the composition,
   wherein the weight ratio of the first metal nanoparticles to the second metal nanoparticles is about 3 to about 9.

2. The conductive ink composition of claim 1, wherein the metal of the first metal nanoparticles is copper.

3. The conductive ink composition of claim 1, wherein the metal of the second metal nanoparticles is silver, gold, nickel, or a combination thereof.

4. The conductive ink composition of claim 1, wherein the first metal nanoparticles and the second metal nanoparticles independently have a shape of a thin sheet, a rod, a needle, or a sphere.

5. The conductive ink composition of claim 1, wherein the first metal nanoparticles have a particle diameter of about 20 to about 50 nm.

6. The conductive ink composition of claim 1, wherein the second metal nanoparticles have a particle diameter of about 10 to about 40 nm.

7. The conductive ink composition of claim 1, wherein the polymer is polyvinylpyrrolidone, polymethylmethacrylate, polymethyl(meth)acrylate, polyvinylacetate, or a combination thereof.

8. The conductive ink composition of claim 1, wherein the solvent is diethylene glycol, 2-methoxyethanol, 2-butoxymethoxyethanol, ethanol, or a combination thereof.

9. A method for manufacturing a conductive thin film, comprising:
   preparing a substrate;
   printing a conductive ink composition of claim 1 on the substrate to form a pattern; and
   light sintering the formed pattern.

10. The method for manufacturing a conductive thin film of claim 9, wherein in the forming of the pattern, the printing is Inkjet printing, spin coating, roll-to-roll printing, screen printing, or a combination thereof.

11. The method for manufacturing a conductive thin film of claim 9, wherein the substrate is a polyimide, polyethylene terephthalate, glass, or a silicon wafer.

12. The method for manufacturing a conductive thin film of claim 9, wherein in the light sintering of the formed pattern, the light is pulsed light.

13. The method for manufacturing a conductive thin film of claim 12, wherein the pulsed light has pulse energy of about 11 to about 33J/cm$^2$.

14. The method for manufacturing a conductive thin film of claim 12, wherein the pulse of the pulsed light has a pulse width of about 1.5 to about 5 ms.

15. The method for manufacturing a conductive thin film of claim 12, wherein the pulse number of the pulsed light is about 1 to about 99.

* * * * *